(12) United States Patent
Maeda et al.

(10) Patent No.: US 12,302,610 B2
(45) Date of Patent: May 13, 2025

(54) SEMICONDUCTOR DEVICE

(71) Applicant: RENESAS ELECTRONICS CORPORATION, Tokyo (JP)

(72) Inventors: Hitoshi Maeda, Tokyo (JP); Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 400 days.

(21) Appl. No.: 17/969,904

(22) Filed: Oct. 20, 2022

(65) Prior Publication Data

US 2024/0136419 A1 Apr. 25, 2024
US 2024/0234528 A9 Jul. 11, 2024

(51) Int. Cl.
*H10D 30/69* (2025.01)
*H10D 30/68* (2025.01)

(52) U.S. Cl.
CPC ........... *H10D 30/694* (2025.01); *H10D 30/68* (2025.01); *H10D 30/6891* (2025.01); *H10D 30/69* (2025.01)

(58) Field of Classification Search
CPC .. H10D 30/694; H10D 30/6891; H10D 30/68; H10D 30/69
See application file for complete search history.

(56) References Cited

U.S. PATENT DOCUMENTS 7,767,522 B2   8/2010  Toba et al.

FOREIGN PATENT DOCUMENTS

JP   2007-281092 A   10/2007

*Primary Examiner* — Mohammad M Choudhry
(74) *Attorney, Agent, or Firm* — Rimon P.C.

(57) ABSTRACT

A height of an upper surface of a control gate electrode is lower than a highest position of a lower surface of a silicide layer on a memory gate electrode adjacent to the control gate electrode via an ONO film. As a result, a structure in contact with the ONO film between the control gate electrode and the memory gate electrode is only the control gate electrode and the memory gate electrode made of polysilicon.

12 Claims, 10 Drawing Sheets

FIG. 12

| | OPERATION METHOD WRITE/ERASE | WRITE OPERATION VOLTAGE(V) Vmg/Vs/Vcg/Vd/Vb | ERASE OPERATION VOLTAGE(V) Vmg/Vs/Vcg/Vd/Vb | READ OPERATION VOLTAGE(V) Vmg/Vs/Vcg/Vd/Vb |
|---|---|---|---|---|
| A | SSI(WRITE)/BTBT(ERASE) | 10/5/1/0.5/0 | −6/6/0/open/0 | 0/0/1.5/1.5/0 |

SEMICONDUCTOR DEVICE

BACKGROUND

The present invention relates to a semiconductor device and, more particularly, to a technique that can be effectively applied to a semiconductor device including a non-volatile memory including a split-gate type transistor.

As a non-volatile semiconductor memory device that can be electrically written and erased, EEPROM (Electrically Erasable and Programmable Read Only Memory) is widely used. These memory device represented by flash memory, which is widely used at present, includes a conductive floating gate electrode or a trapping insulating film surrounded by a silicon oxide film under a gate electrode of a MISFET, and is a device which read out memory information which is charge storage states of the floating gate or the trapping insulating film, as a threshold value of a transistor. The trapping insulating film refers to an insulating film capable of storing electric charges, and examples thereof include a silicon nitride film. The threshold value of MISFET is shifted by injecting and discharging charges into and from the charge storage regions to operate as memory elements. As the flash memory, there is a split-gate type cell using a MONOS (Metal-Oxide-Nitride-Oxide-Semiconductor) film.

There are disclosed techniques listed below.
 [Patent Document 1] Japanese Unexamined Patent Application Publication No. 2007-281092

Patent Document 1 describes that in a split-gate type MONOS memory, a sidewall spacer is formed on a memory gate electrode in contact with an ONO film to prevent the memory gate electrode from being silicided.

SUMMARY

A first gate electrode (control gate electrode) and a second gate electrode (memory gate electrode) configuring the MONOS type memory cell (MONOS memory) are insulated by interposing the ONO (Oxide-Nitride-Oxide) film therebetween. Here, a relatively high voltage is applied to the memory gate electrode, and a high electric field is applied to the ONO film between the control gate electrode and the memory gate electrode. Therefore, securing the breakdown voltage of the ONO film is a critical issue in maintaining the reliability of the device. However, if the silicide layer is formed on an upper surface of each of the control gate electrode and the memory gate electrode in order to reduce the resistance, a short-circuit is likely to occur between the silicide layers, and the reliability of semiconductor device is impaired.

Other purpose and novel features will become apparent from the description of this specification and the accompanying drawings.

The typical ones of the embodiments disclosed in the present application will be briefly described as follows.

In a semiconductor device according to one embodiment, the height of the upper surface of the control gate electrode covered with the capping insulating film is lower than the highest position of the lower surface of the silicide layer on the memory gate electrode.

BRIEF DESCRIPTION OF THE DRAWINGS

FIG. 12 is a table for explaining the operation voltages of the split-gate type memory cell.

DETAILED DESCRIPTION

Figure 1:
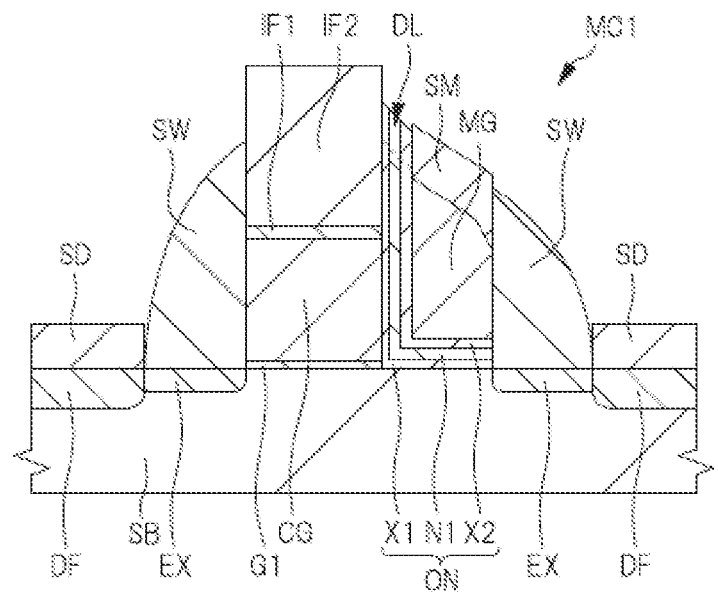
FIG. 1 is a cross-sectional view showing a semiconductor device which is a first embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

First Embodiment

Structure of Semiconductor Device

Hereinafter, a semiconductor device of the present first embodiment will be described with reference to FIG. 1. FIG. 1 is a cross-sectional view showing the semiconductor device of the present embodiment.

The semiconductor device of the present embodiment is a device having a split-gate type memory cell formed of transistors and a low breakdown voltage MISFET which are mounted on a semiconductor substrate. Here, a case in which each transistor is formed as an n-type transistor will be described, but the transistor described below may be a p-type transistor. When a p-type transistor is formed, the conductivity type of the impurities introduced into each region configuring the transistor described below may be changed to a different one.

The transistor referred to in the present application is a MISFET (Metal Insulator Semiconductor Field Effect Transistor), that is, a MIS type field effect transistor.

As shown in FIG. 1, a memory cell (non-volatile memory element) MC1 is formed on a semiconductor substrate SB. The semiconductor substrate SB is made of, for example, monocrystalline silicon, and has an upper surface (first main surface) and an opposing lower surface (second main surface). Although not shown, a p-type well including p-type impurities (for example, B (boron)) is formed in the upper surface of the semiconductor substrate SB deeper than the source and drain regions described later.

On the upper surface of the semiconductor substrate SB, a control gate electrode CG and a memory gate electrode MG respectively extending in a gate width direction (the depth direction in FIG. 1) are formed. The control gate electrode CG is formed on the semiconductor substrate SB via a dielectric film G1 that is a gate dielectric film. On the control gate electrode CG, insulating films IF1, IF2 extending along an upper surface of the control gate electrode CG in the gate width direction are sequentially formed. That is, the dielectric film G1, the control gate electrode CG, the insulating film IF1, and the insulating film IF2 are laminated in this order on the semiconductor substrate SB, thereby forming a first laminated pattern. The first laminated pattern includes the dielectric film G1 formed on the semiconductor substrate SB, the control gate electrode CG formed on the dielectric film G1, the insulating film IF1 formed on the control gate electrode CG, and the insulating film IF2 formed on the insulating film IF1. Each of these films has a similar width to one another in a gate length direction. The gate width direction and the gate length direction are directions along the upper surface of the semiconductor substrate SB and are perpendicular to each other in plan view.

The dielectric film G1 is formed of, for example, a silicon oxide film. The control gate electrode CG is, for example, a semiconductor film formed of an n-type polysilicon film. However, for example, n-type impurities are introduced into each gate electrodes in the present application at a sufficiently high concentration, so that it can be said that the semiconductor film is a conductor having a low resistance. The insulating film IF1 is formed of, for example, a silicon oxide film. The insulating film IF2 is formed of, for example, a silicon nitride film. The thickness of the insulating film IF2 is larger than the thickness of the insulating film IF1. The insulating films IF1, IF2 constitute a cap insulating film of the control gate electrode CG.

One side surface of the control gate electrode CG in the gate length direction is covered with a sidewall spacer SW. The other side surface of the control gate electrode CG is covered with a memory gate electrode MG formed via an ONO (Oxide-Nitride-Oxide) film ON. That is, the memory gate electrode MG is adjacent to the side surface of the first laminated pattern formed of the dielectric film G1, the control gate electrode CG, the insulating film IF1, and the insulating film IF2 via the ONO film ON. The ONO film ON is formed on the upper surface of the semiconductor substrate SB and on the side surface of the first laminated pattern. The memory gate electrode MG is formed on the ONO film ON so as to be adjacent to the control gate electrode CG. The sidewall spacer SW is formed on the side surface of the control gate electrode CG. In the following, this sidewall spacer SW may be referred to as the sidewall spacer SW on the control gate electrode CG side.

Further, the memory gate electrode MG is formed via the ONO film ON sequentially formed on the upper surface of the semiconductor substrate SB. That is, the ONO film ON covers the upper surface of the semiconductor substrate SB and has an L-shaped cross section continuously formed along each of the upper surface of the semiconductor substrate SB and the side surface of the control gate electrode CG. The memory gate electrode MG covers the upper surface of the semiconductor substrate SB via the ONO film ON. That is, on the upper surface of the semiconductor substrate SB and on the side surface of the control gate electrode CG, the memory gate electrode MG is formed via the ONO film ON continuously covering the upper surface of the semiconductor substrate SB and the side surface of the control gate electrode CG. In other words, the memory gate electrode MG covers the upper surface of the semiconductor substrate SB and the side surface of the first laminated pattern via the ONO film ON including charge storage portion.

The ONO film ON is formed of a laminated film in which a silicon oxide film X1, a silicon nitride film N1, and a silicon oxide film X2 are laminated in this order from the semiconductor substrate SB side and the control gate electrode CG side. The memory gate electrode MG is, for example, a semiconductor film formed of a polysilicon film. The silicon nitride film N1 is a trapping insulating film (charge accumulating film, charge storage film). As the trapping insulating film, a high dielectric constant insulating film having a dielectric constant higher than that of the silicon nitride film N1 may be used. The threshold voltage of the memory cell MC1 can be changed by changing charge storage states of the silicon nitride film N1 by the operation of the memory cell MC1. The film thickness of the ONO film ON is, for example, about 20 nm. The film thickness of the silicon oxide film X1 is, for example, 4 nm, the film thickness of the silicon nitride film N1 is, for example, 10 nm, and the film thickness of the silicon oxide film X2 is, for example, 6 nm. Note that the numerical value of the film thickness is an example, and is not limited to these numerical values.

The memory gate electrode MG and the control gate electrode CG are insulated from each other by the ONO film ON interposed therebetween. In addition, the semiconductor substrate SB and the memory gate electrode MG are insulated from each other by interposing the ONO film ON therebetween.

A side surface of the memory gate electrode MG in the gate length direction, which is not in contact with the ONO film ON, is covered with a sidewall spacer SW. That is, the sidewall spacer SW is formed on the side surface of the memory gate electrode MG. In the following, this sidewall spacer SW may be referred to as a sidewall spacer SW on the memory gate electrode MG side. The sidewall spacer SW is formed of, for example, a silicon nitride film, a silicon oxide film, or a laminated film thereof. That is, the sidewall spacers SW are formed in contact with both side surfaces of the pattern including the control gate electrode CG and the memory gate electrode MG along the gate length direction.

Although not shown, a plurality of patterns including the control gate electrode CG and the memory gate electrode MG adjacent to each other via the ONO film ON are formed on the semiconductor substrate SB. The patterns are arranged side by side in the gate length direction. The patterns are spaced apart from each other.

A source region and a drain region (a pair of source and drain regions) are formed in the semiconductor substrate SB on both sides of the pattern in the gate length direction from the upper surface of the semiconductor substrate SB to a predetermined depth. The source region and the drain region are formed in the semiconductor substrate SB exposed from the first laminated pattern and the memory gate electrode MG. Each of the source region and the drain region formed of two n-type semiconductor regions into which n-type impurities (for example, P (phosphorus) or As (arsenic)) are introduced, that is, an extension region EX and a diffusion layer DF. Each of the extension region EX and the diffusion layer DF is formed in the semiconductor substrate SB at a predetermined depth from the upper surface of the semiconductor substrate SB. In other words, each of the pair of source and drain regions, the extension region EX, and the diffusion layer DF is formed in the semiconductor substrate SB in contact with the upper surface of the semiconductor substrate SB.

The extension region EX is a region having a lower n-type impurity concentration than the diffusion layer DF. Here, the diffusion layer DF is formed deeper than the extension region EX. Further, the extension region EX is arranged closer to the upper surface of the semiconductor substrate SB directly below the control gate electrode CG and the memory gate electrode MG than the adjacent diffusion layer DF. As described above, the source and drain regions have an LDD (Lightly Doped Drain) structure including the extension region EX having a low impurity concentration and the diffusion layer DF having a high impurity concentration.

Most of an upper surface of the diffusion layer DF is exposed from the sidewall spacer SW. Most of an upper surface of the extension region EX formed closer to the pattern than the diffusion layer DF is covered with the sidewall spacer SW and the pattern.

The control gate electrode CG and the pair of source and drain regions formed in the semiconductor substrate SB on both sides of the control gate electrode CG constitute a first transistor (control transistor) having a MISFET structure. The memory gate electrode MG and the pair of source and drain regions formed in the upper surface of the semiconductor substrate SB on both sides of the memory gate electrode MG constitute a second transistor (memory transistor) having a MISFET structure. One memory cell MC1 of the present embodiment includes a first transistor and a second transistor that share the source and drain regions with each other. That is, the memory cell MC1 has the control gate electrode CG, the memory gate electrode MG, the ONO film ON, the drain region in the vicinity of the control gate electrode CG, and the source region in the vicinity of the memory gate electrode MG.

An upper surface of the semiconductor substrate SB covered with each of the control gate electrode CG and the memory gate electrode MG includes a channel region in which a channel is formed during operation of the memory cell MC1. The memory cell MC1 is a non-volatile memory element (non-volatile memory) that can be electrically rewritten in both a write operation and an erase operation. The memory cell MC1 of the present embodiment including the control gate electrode CG and the memory gate electrode MG which are adjacent to each other, and the ONO film ON, is called a split-gate type MONOS (Metal Oxide Nitride Oxide Semiconductor) memory. In a semiconductor chip that is the semiconductor device of the present embodiment, a plurality of memory cells MC1 as described above are arranged in an array (matrix) manner in a memory cell region.

On an upper surface of the memory gate electrode MG, a silicide layer SM is formed. A silicide layer SD is formed on the upper surface of the diffusion layer DF. In FIG. 1, the entire silicide layer SD is shown on the upper surface of the semiconductor substrate SB in order to make the depth of implantation, which will be described later, of the diffusion layer DF easy to understand. However, in practice, a part of the thickness of the silicide layer SD is formed inside the semiconductor substrate SB rather than the upper surface of the semiconductor substrate SB. This is because the silicide layer is formed by the reaction between the semiconductor and the metal. In a power supply region (not shown) in which power is supplied to the control gate electrode CG, the silicide layer is formed on the upper surface of the control gate electrode exposed from the insulating films IF1, IF2. The silicide layers SM, SD are made of, for example, NiSi (nickel silicide) or CoSi (cobalt silicide). The silicide layers SM, SD are formed by a well-known salicide process.

The silicide layer SM is provided to reduce the resistivity between the memory gate electrode MG and a contact plug (not shown) connected to the upper surface of the memory gate electrode MG. The silicide layer SD is provided to reduce the resistivity between the diffusion layer DF and a contact plug (not shown) connected to the upper surface of the diffusion layer DF. Each of the semiconductor substrate SB, the control gate electrode CG, the memory gate electrode MG, the insulating films IF1, IF2, and the sidewall spacers SW is covered with an interlayer insulating film (not shown). The contact plug (conductive connection portion) is formed so as to penetrate the interlayer insulating film in the thickness direction.

Here, one of the main features of the semiconductor device of the present embodiment is that the height of the control gate electrode CG is lower than the height of the top of the memory gate electrode MG formed of the polysilicon film under the silicide layer SM. That is, the top of the control gate electrode CG in contact with the ONO film ON is spaced below the top of the memory gate electrode MG in contact with the ONO film. The upper surface of the control gate electrode CG is lower than the highest position of the lower surface of the silicide layer SM. Therefore, the control gate electrode CG is not adjacent to the silicide layer SM via the ONO film ON in any portion. In the present application, the height refers to a distance from the upper surface in a direction (a vertical direction, a thickness direction, and a height direction) perpendicular to the upper surface of the semiconductor substrate SB. Therefore, the ONO film ON at the portion where the silicide layer SM is in contact with and the control gate electrode CG are spaced apart from each other.

In the operation of the memory cell MC1, a higher voltage is applied to the memory gate electrode MG than to the control gate electrode CG. Therefore, a higher electric field is applied to the ONO film ON between the memory gate electrode MG and the control gate electrode CG. In the present embodiment, the silicide layer SM is not formed on the side surface of the ONO film ON on the memory gate electrode MG side, which is a high electric field, and the memory gate electrode MG made of a polysilicon film is located.

In addition, a control gate electrode CG made of a polysilicon film is located on a side surface of the ONO film ON which is a high electric field, instead of a silicide layer on the control gate electrode CG. That is, the entire upper surface of the control gate electrode CG extending in the gate width direction is exposed from the silicide layer except for the power supply portion, and is covered with the capping insulating film made of the insulating films IF1, IF2. In other words, the upper surface of the control gate electrode CG configuring the memory cell MC1 (non-volatile memory element) is exposed from the silicide layer.

Therefore, when the silicide layer on each of the gate electrodes is considered to be part of each of the gate electrodes, the ONO film ON between the control gate electrode CG and the memory gate electrode MG is not in contact with the silicide layer on either the memory gate electrode MG side or the control gate electrode CG side, and is in contact with only polysilicon (semiconductor).

Further, one of the main features of the semiconductor device of the present embodiment is that a difference between a height of a top of the laminated film at a position where the laminated film of the memory gate electrode MG and the silicide layer SM is in contact with the ONO film ON and a height of the control gate electrode CG at a position which is in contact with the ONO film ON is larger than an implantation depth of the diffusion layer SM. That is, in the height direction, the height of the control gate electrode CG is lower than the height of the memory gate electrode MG at a position which is in contact with the side surface of the ONO film ON by the depth of the diffusion layer DF or more. The difference between the upper surface of the control gate electrode CG and the highest position of an upper surface of the silicide layer SM is equal to or larger than the depth of the diffusion layer DF. Also, the difference between the height between the upper surface of the semiconductor substrate SB and the highest position of the silicide layer SM and the height between the upper surface of the semiconductor substrate SB and the upper surface of the control gate electrode CG is equal to or larger than the depth of the diffusion layer DF.

The diffusion layer DF is a semiconductor region which is formed by implanting n-type impurities (for example, P (phosphorus) or As (arsenic)) perpendicularly to the upper surface of the semiconductor substrate SB by an ion implantation method and then thermally diffusing the impurities. In the ion implantation step, impurities are also implanted into the ONO film ON exposed above the region between the control gate electrode CG and the memory gate electrode MG. Consequently, a damage layer DL is formed in the ONO film ON from the uppermost end of the ONO film ON to a depth equivalent to the depth of the diffusion layer DF.

Here, the height of the control gate electrode CG at the position in contact with the ONO film ON is lower than the height of the lower end of the damage layer DL. Each depth of the diffusion layer DF and the damage layer DL is, for example, 10 nm to 25 nm, and in particular nm here. Therefore, if the thickness of the silicide layer SM is equal to or greater than 20 nm, the damage layer DL and the control gate electrode CG are spaced apart from each other.

Operation of Semiconductor Device

Next, the operation of the non-volatile memory in the semiconductor device of the present embodiment will be mainly described with reference to FIG. 12. FIG. 12 is a table for explaining the operation voltages of the split-gate type memory cell.

The memory cell of the present embodiment has a MISFET structure, and is a memory cell which read out memory information which is charge storage states of the trapping insulating film under the gate electrode of the MISFET, as a threshold value of the transistor. The trapping insulating film refers to an insulating film capable of storing electric charges, and examples thereof include a silicon nitride film. The threshold value of the MISFET is shifted by injecting charges into charge storage region and discharging charges from charge storage region, thereby causing MISFET to operate as storage elements. As a non-volatile semiconductor memory device using the trapping insulating film, there is a split-gate type MONOS memory, such as a memory cell of the present embodiment.

FIG. 12 is a table showing exemplary conditions for applying voltages to the respective portions of the selected memory cell at the time of "write", "erase", and "read" of the present embodiment. The tables in FIG. 12 describe the voltage Vmg to be applied to the memory gate electrode MG of the memory cell MC1 shown in FIG. 1, the voltage Vs to be applied to the source region, the voltage Vcg to be applied to the control gate electrode CG, the voltage Vd to be applied to the drain region, and the base voltage Vb to be applied to the p-type well (not shown) of the upper surface (surface) of the semiconductor substrate SB at each the time of "write", "erase", and "read". Here, the selected memory cell refers to a memory cell selected as a target for "write", "erase", or "read".

In the non-volatile memory shown in FIG. 1, the semiconductor region on the memory gate electrode MG side is a source region, and the semiconductor region on the control gate electrode CG side is a drain region. Further, what is shown in the table of FIG. 12 is a preferred example of the application condition of the voltage, but is not limited to this, it can be variously modified as necessary. In the present embodiment, the injection of electrons into the silicon nitride film N1, which is charge storage portion in the ONO film ON of the memory transistor, is defined as "write", and the injection of holes is defined as "erase".

Here, the case where the write method is SSI (Source Side Injection) method and the erase method is BTBT (Band-To-Band Tunneling) method is explained. The SSI method can be regarded as a method of writing a memory cell by injecting hot electrons into the silicon nitride film N1 (refer to FIG. 1). The BTBT method can be regarded as a method of erasing the memory cell by injecting hot holes into the charge storage portion (the silicon nitride film N1 in the ONO film ON). Hereafter, details thereof will be described.

In the write method in this case, in the write by SSI method, for example, a voltage (Vmg=10 V, Vs=5 V, Vcg=1 V, Vd=0.5 V, Vb=0 V) as shown in the "write operation voltage" in the table of FIG. 12 is applied to each portion of the selected memory cell to be written, and electrons are injected into the silicon nitride film N1 in the ONO film ON of the selected memory cell to perform writing.

At this time, hot electrons are generated in the channel region (between source and drain) under the two gate electrodes (the memory gate electrode MG and the control gate electrode CG), and hot electrons are injected into the silicon nitride film N1 that is charge storage portion in the ONO film ON under the memory gate electrode MG. The injected hot electrons are trapped in the trap levels in the silicon nitride film N1 configuring the ONO film ON, and consequently the threshold voltage of the memory transistor rises. That is, the memory transistor is in a write state.

In the write operation, the voltage applied to each portions of the non-selected memory cell which is adjacent to the selected memory cell and is connected to word line common to the selected memory cell is the same as the voltage applied to the selected memory cell except that the voltage Vd applied to the drain region is 1.5 V. That is, in the write operation, voltage condition where the voltage applied to the non-selected cell in which the voltage applied to the control gate electrode CG is the same as the selected cell is Vmg=10 V, Vs=5 V, Vcg=1 V, Vd=1.5 V, Vb=0 V. That is, Vdd voltage is applied to the drain region of the non-selected cell.

In the erase by BTBT method, for example, a voltage (Vmg=−6 V, Vs=6 V, Vcg=0 V, Vd=open, Vb=0 V) as shown in the "erase operation voltage" in the column A of the table of FIG. 12 is applied to the respective portions of the selected memory cell to be erased. As a result, holes are generated by BTBT phenomena and accelerated by electric field, holes are injected into the silicon nitride film N1 configuring the ONO film ON of the selected memory cell, thereby lowering the threshold voltage of the memory transistor. That is, the memory transistor is in an erase state.

At the time of read, for example, a voltage (Vmg=0 V, Vs=0 V, Vcg=1.5 V, Vd=1.5 V, Vb=0 V) as shown in the "read operation voltage" of FIG. 12 is applied to the respective portions of the selected memory cell to be read. The write state and the erase state can be distinguished by setting the voltage Vmg applied to the memory gate electrode MG at the time of read to a value between the threshold voltage of the memory transistor in the write state and the threshold voltage in the erase state.

Effects of Semiconductor Device

Figure 13:
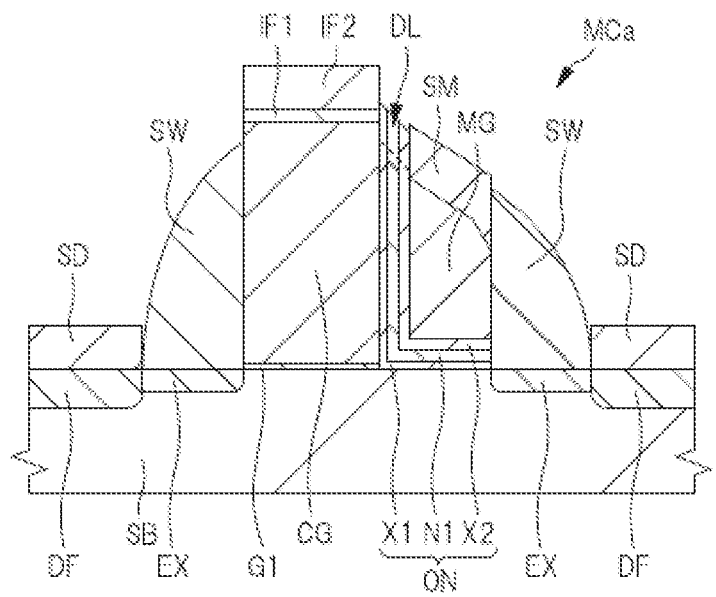
FIG. 13 is a cross-sectional view showing a semiconductor device that is a first comparative example.

In the following, the effect of the semiconductor device of the present embodiment will be described with reference to FIG. 13 showing the first comparative example. FIG. 13 is a cross-sectional view showing a semiconductor device of the comparative example, and is a cross-sectional view including a split-gate type memory cell.

The memory cell MCa configuring the semiconductor device of the first comparative example shown in FIG. 13 has the same configuration as the memory cell MC1 shown in FIG. 1 except for the height (film thickness) of the control gate electrode CG and the film thickness of the insulating film IF2. In the memory cell MCa of the comparative example, the height of the control gate electrode CG is higher than the highest position of the lower surface of the silicide layer SM, and a part of the upper portion of the control gate electrode CG is adjacent to the silicide layer SM via the ONO film ON.

In the split-gate type memory cell, it is desirable to form the silicide layer on the polysilicon in order to lower wiring resistance of each of the gate electrodes from the viewpoint of improving the operation rate. However, it is desirable that the electrode in contact with the ONO film is polysilicon, and it is known that when the silicide is formed on the ONO film, the breakdown voltage decreases. Hereinafter, the term "memory gate electrode" or "control gate electrode" also includes an upper silicide layer.

From the viewpoint of maintaining the breakdown voltage, it is most desirable that the respective configurations of the control gate electrode and the memory gate electrode sandwiching the ONO film are polysilicon. In comparison with this case, when either one of the control gate electrode and the memory gate electrode sandwiching the ONO film is made of silicide, the breakdown voltage is decreased. In addition, when both the control gate electrode and the memory gate electrode sandwiching the ONO film are made of silicide, the breakdown voltage is further decreased as compared with this case. In a case where the height of the memory gate electrode with respect to the control gate electrode is not strictly controlled, the breakdown voltage may be decreased as described above.

In the first comparative example shown in FIG. 13, the ONO film ON between the control gate electrode CG and the silicide layer SM on the memory gate electrode MG has the damage layer DL. The damage layer DL is a region in which impurities are implanted into the ONO film ON in an ion-implantation process performed for forming the diffusion layer DF. In particular, when impurities are implanted into the ONO film ON with $1\times10^{21}$ cm$^{-3}$ level, it is considered that the breakdown voltage between the control gate electrode CG and the memory gate electrode MG may be decreased. That is, the insulating performance of the ONO film ON having the damage layer DL is lower than that of the ONO film ON having no damage layer DL. Therefore, the breakdown voltage between the control gate electrode CG and the memory gate electrode MG is further decreased by the presence of the damage layer DL between the control gate electrode CG and the memory gate electrode MG.

When the breakdown voltage is low, a short-circuit is likely to occur between the control gate electrode and the memory gate electrode, and thus the breakdown voltage needs to be increased and the reliability of the semiconductor device needs to be improved.

As a method of effectively lowering the resistance of the gate wiring (gate electrode), it is conceivable to use a shunt-structure in which a low-resistance metal wiring is arranged side by side on the upper layer of the memory cell and the metal wiring is connected to the gate wiring at regular intervals. As in the first comparative example, there is no need to form the silicide layer SM extending along the gate width direction together with the memory gate electrode MG on the memory gate electrode MG, and the breakdown voltage can be improved. However, as the gate wiring resistance is higher, the distance of the connecting portion (power supply portion) between the metal wiring and the gate wiring needs to be shortened, and the area of the power supply region per memory capacity increases, thus sacrificing the integration degree of the memory cells.

On the other hand, in the semiconductor device of the present embodiment, as shown in FIG. 1, the height of the memory gate electrode MG under the silicide layer SM is set higher than that of the control gate electrode CG. Here, the height of the control gate electrode CG is, for example, 60 nm, while the height of the memory gate electrode MG at a position in contact with the ONO film is 70 nm. Therefore, the height of the memory gate electrode MG is 10 nm higher than the height of the control gate electrode CG. The film thickness of the silicide layer SM is, for example, 20 nm. Therefore, the height of the laminated film including the memory gate electrode MG and the silicide layer SM is 30 nm higher than the height of the control gate electrode CG.

Thus, the silicide layer SM in contact with the ONO film ON and the control gate electrode CG in contact with the ONO film ON is spaced apart in the height direction. Therefore, the control gate electrode CG and the memory gate electrode MG sandwiching the ONO film ON are each formed of a polysilicon film. Therefore, in the memory cell MC1 of the present embodiment as compared with the memory cell MCa of the first comparative example, the breakdown voltage between the control gate electrode CG and the memory gate electrode MG can be improved.

Here, the difference between the height of the laminated film formed of the silicide layer SM and the memory gate electrode MG and the height of the control gate electrode CG is larger than the implantation depth of the diffusion layer DF. This implantation depth is an implantation depth (high concentration implantation depth) when impurity implantation is performed at a 21st power level, that is, at $1\times10^{21}$ cm$^{-3}$ level. As a result, the control gate electrode CG is spaced apart from the damage layer DL caused by the implantation in upper portion of the ONO film ON. Therefore, the breakdown voltage between the control gate electrode CG and the memory gate electrode MG can be improved because the ONO film ON sandwiched between the laminated film on the memory gate electrode MG side and the control gate electrode CG does not have the damage layer DL. If the height of the laminated film including the memory gate electrode MG and the silicide layer SM is higher than the height of the control gate electrode CG by 30 nm or more, decrease of the breakdown voltage due to the presence of the damage layer DL can be prevented more reliably.

As described above, in the present embodiment, the control gate electrode CG is formed to be lower with respect to the height of the memory gate electrode MG, and the silicide layer SM is formed on the memory gate electrode MG, and the distance of the connecting portion between the metal wiring and the gate wiring is not reduced. Therefore, it is possible to prevent the integration degree of the memory cell MC1 arranged in an array manner from becoming low, and to improve the breakdown voltage in the memory cell MC1. Therefore, the performance of the semiconductor device can be improved.

First Modified Example

In the above explanation using FIG. 1, it is explained that the height of the control gate electrode CG is lowered, but this configuration is also desirable from the viewpoint of forming the contact plug connected to the diffusion layer DF and the like in a small size. Hereinafter, a case where the memory cell and MISFET in the peripheral region are mixed will be described with reference to FIG. 2.

The semiconductor chip which is the semiconductor device includes a memory cell region and a peripheral region. The memory cell region is a region in which a plurality of memory cells, which are non-volatile memory elements, are arranged in an array manner. The peripheral region (logic region) is a region that differs from the memory cell region, and is, for example, a region in which a low breakdown voltage MISFET (Metal Insulator Semiconductor Field Effect Transistor) configuring a logic circuit is formed. The low breakdown voltage MISFET (low breakdown voltage transistor) is a transistor that is required to operate at a higher operating rate than a high breakdown voltage transistor used in a power supply or the like, and is driven at a lower voltage.

Figure 2:
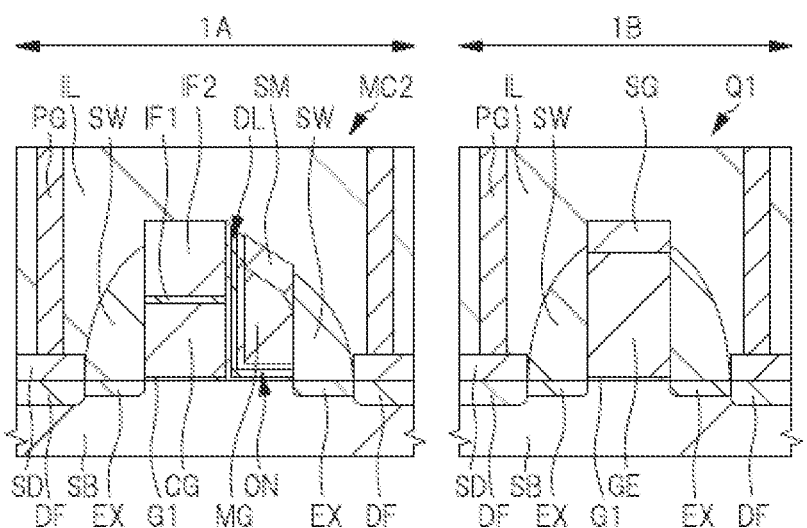
FIG. 2 is a cross-sectional view showing a semiconductor device which is a first modified example of the first embodiment.

In FIG. 2, a cross section of the memory cell region 1A and a cross section of the peripheral region (logic region) 1B are shown in order from the left side. In FIG. 2, wiring layers including wiring on the interlayer insulating film IL are not illustrated.

As shown in FIG. 2, a memory cell MC2 having the same configuration as the memory cell MC1 described with reference to FIG. 1 is formed in the memory cell region 1A. On the semiconductor substrate SB in the peripheral region 1B, a gate electrode GE extending in the gate width direction is formed. The gate electrode GE is formed on the semiconductor substrate SB via a dielectric film G1 that is a gate dielectric film. Note that the dielectric film G1 in the memory cell region 1A and the dielectric film G1 in the peripheral region 1B are films of the same layer. The term "film of the same layer" as used herein refers to a relationship between a plurality of films formed by processing and separating one film formed by the same manufacturing process. However, the dielectric film G1 in the memory cell region 1A and the dielectric film G1 in the peripheral region 1B may not be the film of same layer, and may be a film formed in a separate process. The gate electrode GE is formed of, for example, a polysilicon film (semiconductor film). A silicide layer SG is formed on an upper surface of the gate electrode GE in contact with the upper surface of the gate electrode GE.

Each of the side surfaces on both sides of the gate electrode GE in the gate length direction is covered with a sidewall spacer SW. A source region and a drain region (a pair of source and drain regions) are formed in the upper surface of the semiconductor substrate SB on both sides of the gate electrode GE in the gate length direction. The source region and the drain region are formed in the semiconductor substrate SB exposed from the gate electrode GE. Each of the source and drain regions is formed of two n-type semiconductor regions in which n-type impurities (e.g., P (phosphorus) or As (arsenic)) are introduced, that is, extension region EX and diffusion layer DF, similarly to the source and drain regions of the memory cell region 1A.

The gate electrode GE and the pair of source and drain regions formed in the semiconductor substrate SB on both sides of the gate electrode GE configure a low breakdown voltage transistor Q1 having a MISFET structure. Although one transistor Q1 formed on one semiconductor substrate SB is illustrated, a plurality of transistors Q1 may be formed on one semiconductor substrate SB. The upper surface of the semiconductor substrate SB covered by the gate electrode GE includes a channel region in which a channel is formed when the transistor Q1 is operated.

The first transistor and the second transistor configuring the memory cell MC2 are transistors driven at a higher voltage than the low breakdown voltage transistor Q1 configuring the logic circuit. Therefore, the first transistor and the second transistor are required to have higher breakdown voltage performance than the transistor Q1.

Here, the control gate electrode CG is a film of same layer as the gate electrode GE. That is, the gate electrodes are formed by patterning one polysilicon film when the film is formed in the manufacturing process. Therefore, it is considered that the height of the control gate electrode CG is the same as the height of the gate electrode GE in the peripheral region 1B. However, since the cap insulating film made of the insulating film IF1, IF2 is formed on the control gate electrode CG, the height of the laminated film including the control gate electrode CG and the insulating films IF1, IF2 is higher than the height of the gate electrode GE. Since the interlayer insulating film IL covering the memory cell is thickly formed, it is difficult to form a connection hole (opening portion) for filling the contact plug PG penetrating the interlayer insulating film IL.

The interlayer insulating film IL is mainly made of, for example, a silicon oxide film, and the contact plug PG is mainly made of, for example, W (tungsten). In the opening process of the connection hole using a photolithography technique and a dry etching method, when the interlayer insulating film IL is thick, it may be difficult to form the connection hole so as to reach the lower end of the interlayer insulating film IL. When the opening width of the connection hole is set to be large in order to reliably form the connection hole, a problem arises in that the integration degree of the semiconductor device is lowered.

Although the thickness of the insulating film IF1 is small, the thickness of the insulating film IF2 is, for example, 40 nm. Therefore, when the height difference between the laminated film and the gate electrode GE is larger than 40 nm, it is considered that the manufacturing of the semiconductor device becomes difficult.

On the other hand, in the present modified example, in the manufacturing process of the semiconductor device, after a polysilicon film for forming the control gate electrode CG and the gate electrode GE is formed, etching back is performed while the polysilicon film in the peripheral region 1B is covered with the photoresist film. The thickness of the polysilicon film is, for example, 100 nm. Accordingly, the height of the polysilicon film in the memory cell region 1A is made lower than that of the polysilicon film in the peripheral region 1B. The thickness of the polysilicon film in the memory cell region 1A after the etch-back is, for example, 60 nm. Thereafter, the insulating films IF1, IF2 are sequentially formed on the polysilicon film, then the insulating films IF1, IF2 are remained in a part of the memory cell region 1A and the other insulating films are removed. Next, the polysilicon film is patterned to form the control gate electrode CG and the gate electrode GE. When the control gate electrode CG is compared with the gate electrode GE, the height of the control gate electrode CG is lower than the height of the gate electrode GE. The height between the upper surface of the semiconductor substrate SB and the upper surface of the control gate electrode CG is lower than the height between the upper surface of the semiconductor substrate SB and the upper surface of the gate electrode GE. One of the main features of the present modified example is thus that the height of the control gate electrode CG is lower than the height of the gate electrode GE.

Therefore, it is possible to reduce differences between the height of the laminated film including the control gate electrode CG and the insulating films IF1, IF2 and the height of the gate electrode GE. It is desirable to eliminate this difference so that the height of the laminated film and the height of the gate electrode GE are the same. This eliminates the need for forming the interlayer insulating film IL with a large film thickness, and facilitates forming a connection hole (opening portion) for filling the contact plug PG. That is, it is possible to reduce the thickness of the interlayer insulating film IL, prevent the contact plug from being formed defective, and reduce the width of the contact plug PG. Therefore, the reliability of the semiconductor device can be improved, and further, the performance of the semiconductor device can be improved by improving the integration degree of the semiconductor element.

Second Modified Example

Figure 14:
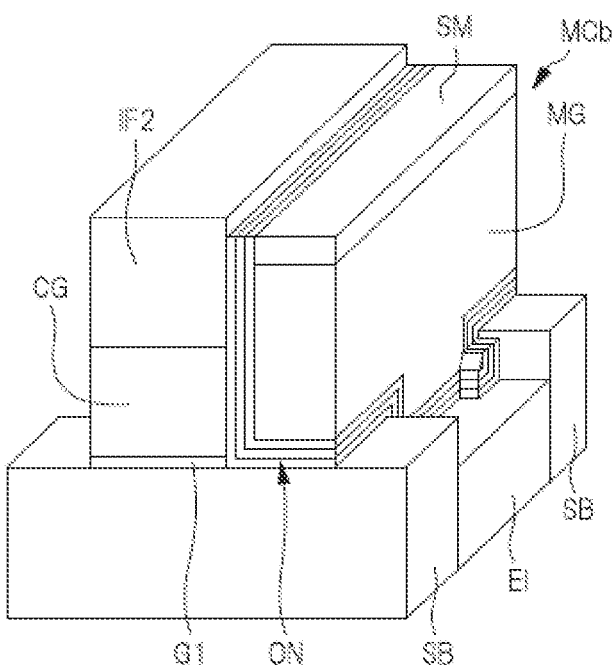
FIG. 14 is a perspective view showing a semiconductor device according to a second comparative example.
Figure 15:
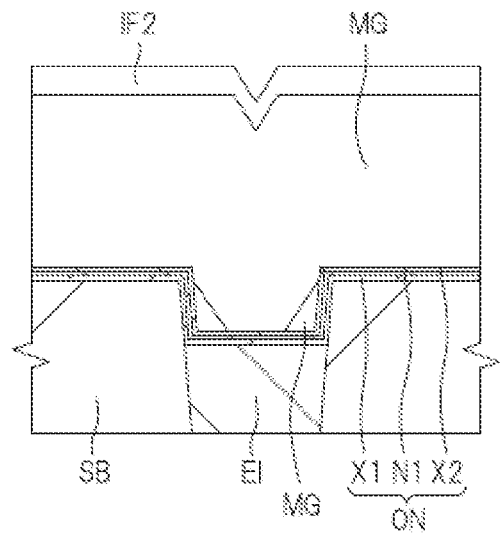
FIG. 15 is a cross-sectional view showing a side surface and a cross section of a part of the semiconductor device of the second comparative example.

First, a problem to be solved in the present modified example will be described using second comparative example. FIG. 14 is a perspective view of the semiconductor device of the second comparative example. FIG. 15 shows a cross-sectional view including a side surface of a part of the semiconductor device and a cross section of the part of second comparative example. In FIG. 15, each side surface of the ONO film ON, the memory gate electrode MG, and the insulating film IF2 is shown, and a cross section of the semiconductor substrate SB and an element isolation region EI is shown. Note that in the perspective views shown in FIGS. 14 and 3, hatching is omitted in order to make the drawing easy to see.

As shown in FIG. 14, in order to reduce the cell area of the memory cell MCb, it is conceivable to form a recess portion by recessing an upper surface of the element isolation region EI between the memory cells MCb arranged in the gate width direction downward with respect to the upper surface of the semiconductor substrate SB.

The element isolation region (element isolation portion) EI is an insulating film that fills a part of trench formed on the upper surface of the semiconductor substrate SB. However, the element isolation region EI does not completely fill the trench. The element isolation region EI is made of, for example, a silicon oxide film. The element isolation region EI has an STI (Shallow Trench Isolation) structure.

When the channel width of the memory cell MCb in the planar layout is reduced by 50%, the original effective channel width of the memory cell MCb can be secured by setting the recess amount of the upper surface of the element isolation region EI with respect to the upper surface of the semiconductor substrate SB in the height direction to ¼ of the original channel length (gate width) W.

For example, when the channel length of 160 nm is reduced by 50% to 80 nm, if the recess amount of the element isolation region EI is 40 nm, the channel length on the side surface of the trench in which the element isolation region EI is embedded is 80 nm in total, the effective channel width of 160 nm can be ensured.

However, the memory gate electrode MG at the end of the element isolation region EI becomes thicker by the recess amount. Therefore, the etch-back amount in forming the memory gate electrode MG also includes the recess amount of the element isolation region EI. When such etch-back amount is not added, as shown in FIGS. 14 and 15, the residue of the polysilicon film configuring the memory gate electrode MG is generated at the end of the trench on the element isolation region EI, causing a defect. The defect may be, for example, a decrease in breakdown voltage caused by contact between the ONO film ON and the silicide layer when the remaining part of the memory gate electrode MG is silicided. Further, as another defect, a defect such as a short-circuit between the memory gate electrodes MG facing each other may occur between the memory cells MCb arranged in the gate length direction.

Therefore, the recess amount of the element isolation region EI needs to be added to the etch-back amount of the memory gate electrode MG when the upper surface of the element isolation region EI is to be recessed. As a result, the difference between the top of the memory gate electrode MG and an upper surface of the insulating film IF2 in the height direction is increased by the recess amount of the element isolation region EI (see FIG. 5).

Figure 3:
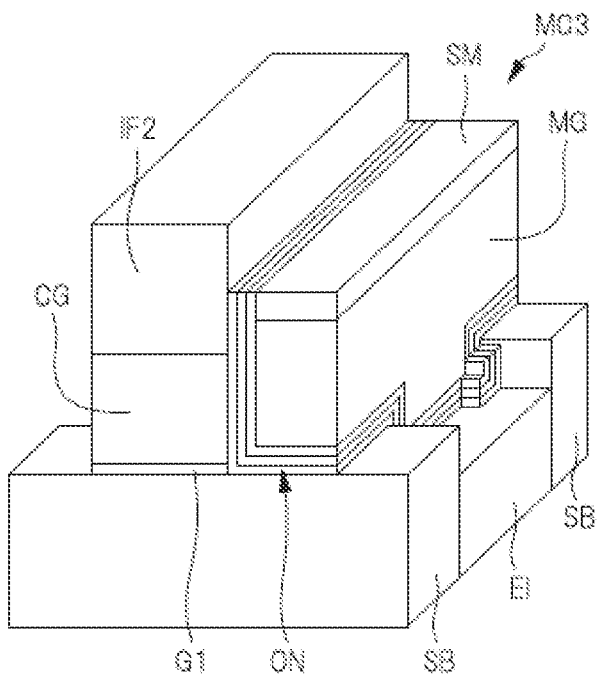
FIG. 3 is a perspective view showing a semiconductor device which is a second modified example of the first embodiment.
Figure 4:
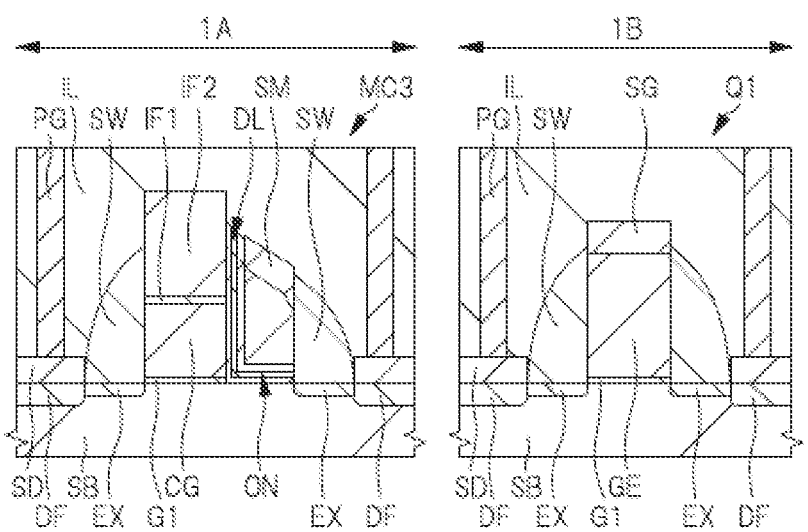
FIG. 4 is a cross-sectional view showing the semiconductor device which is the second modified example of the first embodiment.
Figure 5:
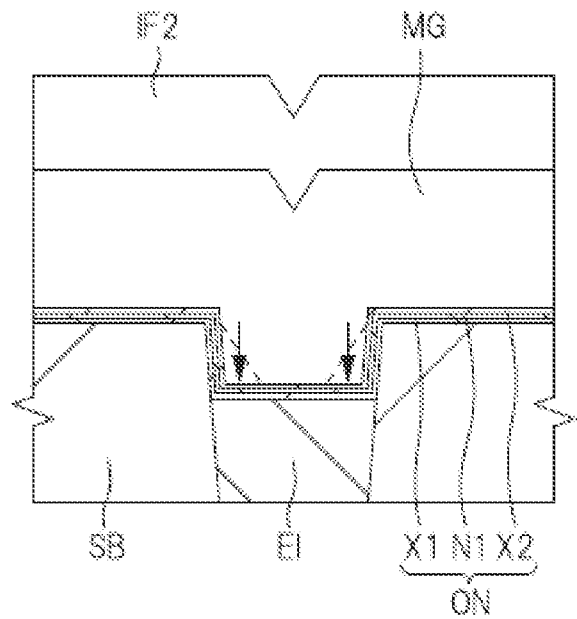
FIG. 5 is a cross-sectional view showing a side view and a cross-section of a part of the semiconductor device that is the second modified example of the first embodiment.

FIG. 3 shows a perspective view of the semiconductor device of the present embodiment. FIG. 4 also shows a cross-sectional view including a side surface of a part of the semiconductor device of the present embodiment and a cross-section of the part. FIG. 5 shows a cross-sectional view of the semiconductor device of the present embodiment. FIG. 4 shows the memory cell MC3 and the transistor Q1 as in FIG. 2. In FIG. 5, each side surface of the ONO film ON, the memory gate electrode MG, and the insulating film IF2 is shown, and a cross section of the semiconductor substrate SB and the element isolation region EI is shown. FIG. 5 is a cross-sectional view when the memory cell MC3 is viewed from the gate length direction (right side in FIGS. 3 and 4). In FIG. 3 and FIG. 5, the source and drain regions, the silicide layer SD thereon, the element isolation region and wiring layer are not shown. In FIG. 5, the silicide layer on the memory gate electrode MG is not shown. In FIG. 4, the element isolation region and wiring layer are not shown.

As shown in FIGS. 3 to 5, in the present modified example, the element isolation region EI extending along the gate length direction is embedded in the trench formed in the upper surface of the semiconductor substrate SB. The upper surface of the element isolation region EI is recessed downward by a predetermined recess amount relative to the upper surface of the semiconductor substrate SB. The control gate electrode CG and the memory gate electrode MG extend across the element isolation region EI in the gate width direction. That is, the control gate electrode CG and the memory gate electrode MG extend over the element isolation region EI in the gate width direction.

Here, the height of the memory gate electrode MG configuring the memory cell MC3 of the present modified example is lower than that of the memory cell MCb described with reference to FIGS. 14 and 15. This is because the recess amount of the element isolation region EI is added to the etch-back amount in the etch-back process performed when the memory gate electrode MG is formed. The memory gate electrode MG is formed in a sidewall shape by etching back a polysilicon film formed on the side surface of the laminated film including the control gate electrode CG and the insulating films IF1, IF2 via the ONO film ON. Since the recess amount is added to the etch-back amount, the difference between the height of the laminated film and the height of the sidewall-shaped laminated film including the ONO film ON and the memory gate electrode MG is equal to or greater than the recess amount of the element isolation region EI. In other words, the difference is equal to or greater than the distance between the upper surface of the element isolation region EI and the upper surface of the semiconductor substrate SB in the height direction.

Since the control gate electrode CG is formed of a film having the same layer as the gate electrode GE in the peripheral region 1B other than the memory cell region 1A, in order to make the memory gate electrode MG higher than the control gate electrode GE as described with reference to FIG. 1, the insulating film IF2 needs to be increased. Further, when the upper surface of the element isolation region EI is to be recessed, the difference between the top of the insulating film IF2 and the top of the memory gate electrode MG needs to be equal to or larger than the recess amount of the element isolation region EI However, if an interlayer insulating film thicker than the interlayer insulating film IL required for the peripheral region 1B is formed by this method, the opening of the connection hole for filling the contact plug becomes difficult, which is not preferable for the mixed loading process.

As described in the first modified example, also in the present modified example, the height of the control gate electrode CG can be made lower than the height of the gate electrode GE in the peripheral region 1B, so that the opening of the connection hole can be easily made, and the same advantages as those of the first modified example can be obtained.

Third Modified Example

When an upper surface of the interlayer insulating film covering the memory cell is polished and planarized by, for example, CMP (Chemical Mechanical Polishing), the polishing rate changes when the capping insulating film (silicon nitride film) on the control gate electrode is exposed from the interlayer insulating film in the memory cell region. Consequently, the flatness of the upper surface of the interlayer insulating film IL and wiring layer further thereon between the memory cell region and the peripheral region are degraded.

Figure 6:
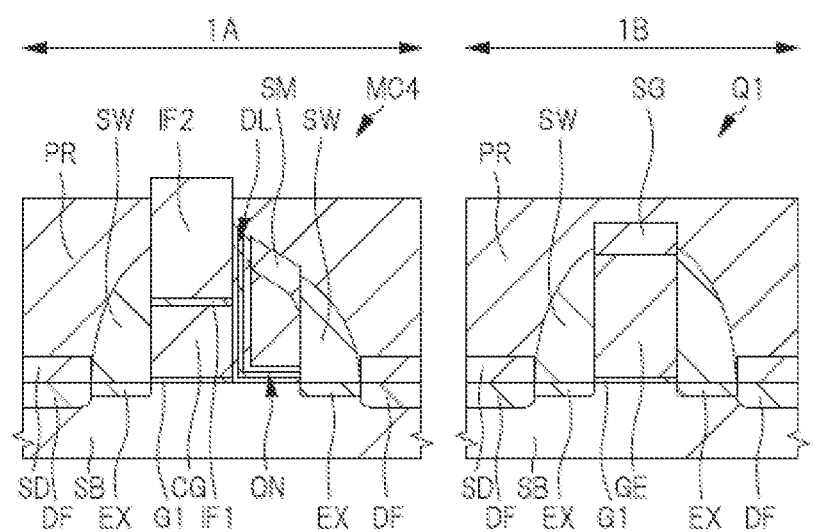
FIG. 6 is a cross-sectional view showing a manufacturing process of a semiconductor device which is a third modified example of the first embodiment.
Figure 7:
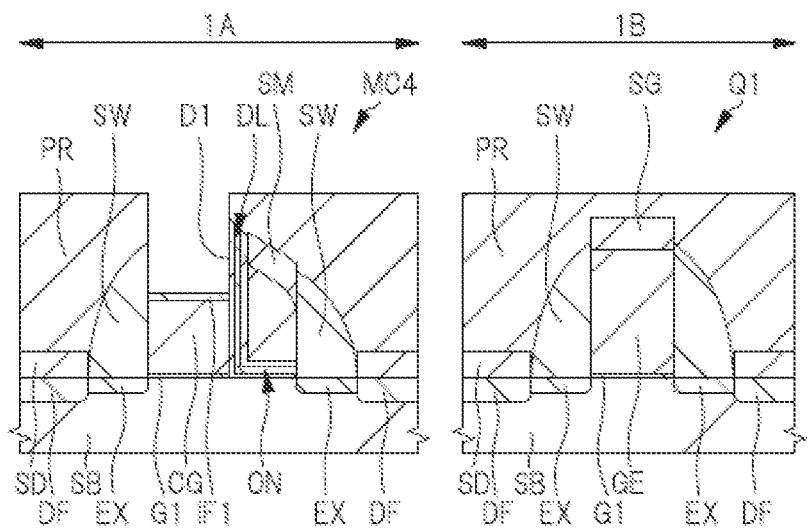
FIG. 7 is a cross-sectional view showing a manufacturing process of the semiconductor device subsequent to FIG. 6.

Therefore, in the present modified example, as shown in FIG. 6, after the silicide layer is formed, the photoresist film PR is applied, and then the photoresist film PR is etched back to expose the insulating film IF2. Next, as shown in FIG. 7, the insulating film IF2 is removed by thermal phosphoric acid, and a trench D1 is formed on the control gate electrode CG. That is, directly above the control gate electrode CG, the trench D1 which is a concave portion is formed between a part of the sidewall spacer SW that is in contact with the side surface of the control gate electrode CG and is located above the control gate electrode CG, and a part of the ONO film that is in contact with the other side surface of the control gate electrode CG and is located above the control gate electrode CG. That is, the trench D1 is formed of the upper surface of the control gate electrode CG, a part of the sidewall spacer SW located above the upper surface of the control gate electrode CG, and a part of the ONO film ON located above the upper surface of the control gate electrode CG. The dielectric film G1 and the control gate electrode CG under the trench D1 form a second laminated pattern.

Figure 8:
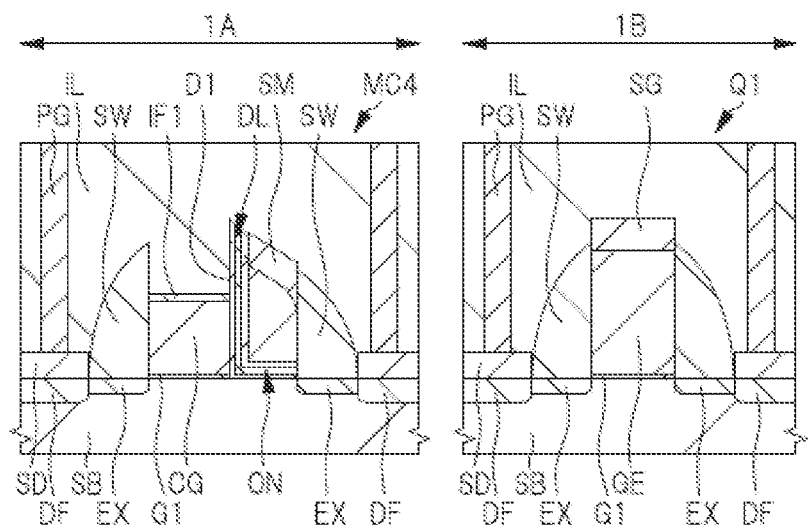
FIG. 8 is a cross-sectional view showing a manufacturing process of the semiconductor device subsequent to FIG. 7.

Thereafter, as shown in FIG. 8, after the interlayer insulating film IL is formed so as to fill the trench (concave portion) D1 and to cover the memory cell MC4 and the transistor Q1, the upper surface of the interlayer insulating film IL is planarized by CMP method. The interlayer insulating film IL covers the upper surface of the semiconductor substrate SB, the control gate electrode CG, the memory gate electrode MG, and the sidewall spacers SW. Thereafter, a plurality of connection holes penetrating the interlayer insulating film IL are formed by photolithography and dry etching method. Subsequently, a contact plug PG is formed to fill each of the connection holes.

The contact plugs PG are electrically connected to the gate electrode GE, the control gate electrode CG, the memory gate electrode MG, or the source and drain regions via silicide layers. Wiring layers (not shown) including wirings are formed on the contact plugs PG. An upper surface of the contact plug PG is connected to wiring. The contact plug PG is mainly made of W (tungsten), for example.

By doing so, the silicon nitride film is prevented from being exposed from the interlayer insulating film IL in the planarization step of the interlayer insulating film IL, so that the interlayer insulating film IL can be made thin with good flatness, and the opening margins of the connection holes can be secured.

Second Embodiment

In the following, it will be described that, when the silicide layers extending in the gate width direction are formed on the upper surface of each of the control gate electrode and the memory gate electrode, the breakdown voltage between the gate electrodes is prevented from decreasing.

Figure 16:
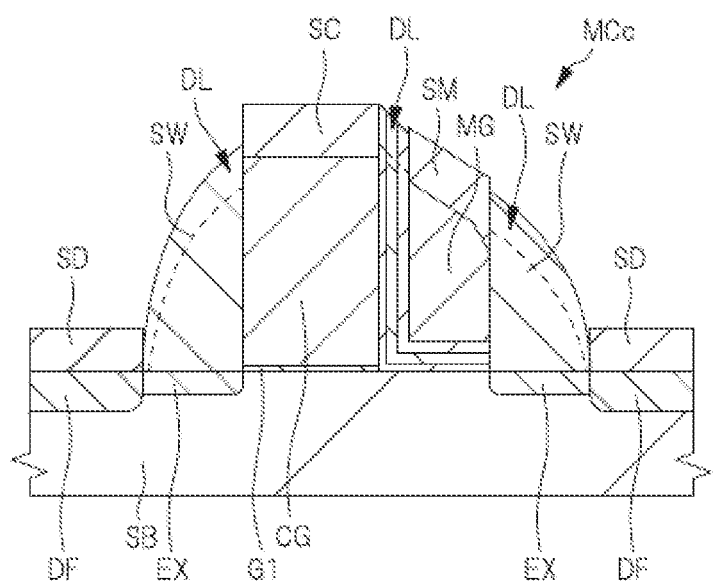
FIG. 16 is a cross-sectional view showing a semiconductor device that is a third comparative example.

FIG. 16 shows a cross-sectional view of the memory cell of the third comparative example. In the memory cell MCc of the third comparative example, no cap insulating film is formed on the control gate electrode CG, and the silicide layer SC is formed. The silicide layer SC is adjacent to the silicide layer SM on the memory gate electrode MG via the ONO film ON. Here, the sidewall spacers SW and the ONO film ON have damage layers DL caused by the implantation of impurities when the diffusion layer DF is formed. The damage layer DL is formed from an upper surface of each of the sidewall spacers SW and the ONO film ON to a depth equivalent to the implantation depth of the diffusion layer DF. Therefore, since the ONO film ON having the damage layer DL is sandwiched between the silicide layers SC, SM, a short-circuit is likely to occur between the control gate electrode CG and the memory gate electrode MG in the structure of the third comparative example.

Figure 17:
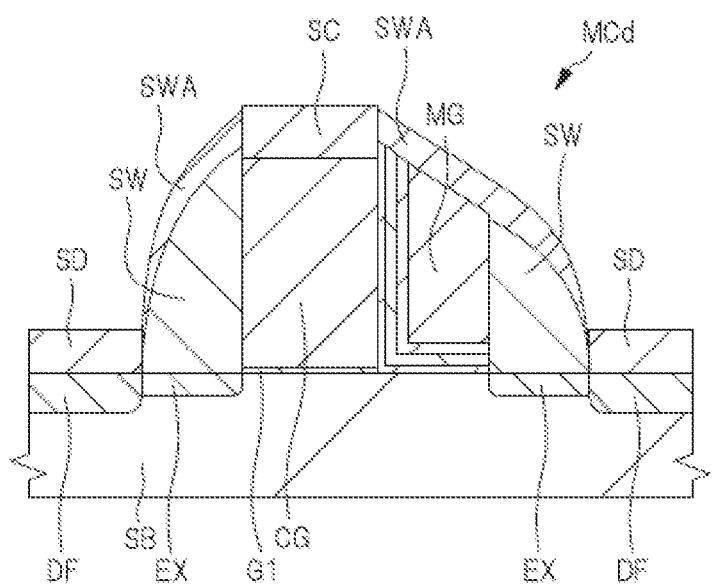
FIG. 17 is a cross-sectional view showing a semiconductor device that is a fourth comparative example.

Therefore, as in the memory cell MCd of the fourth comparative example shown in FIG. 17, it is conceivable that, after the memory gate electrode MG is formed in a sidewall shape by etch-back next to the control gate electrode CG, an insulating film made of a silicon oxide film is laminated on the memory cell MCd, and etch-back is performed again to expose the upper surface of the control gate electrode CG, whereby the sidewall spacer SWA made of the insulating film is formed so as to cover the upper surface of each of the sidewall spacers SW, the ONO film ON and the memory gate electrode MG.

Thereafter, a diffusion layer DF is formed by an ion-implantation process, and then a salicide process is performed to form silicide layers SD, SC. If the thickness of the sidewall spacer SWA in the height direction is the same as the implantation depth of the diffusion layer DF, it is possible to prevent the damage layer DL due to the implantation from occurring in the ONO film ON. However, since the silicide layer is not formed on the memory gate electrode MG, it is not possible to reduce the resistance of the memory gate electrode MG.

Therefore, in the present embodiment, a sidewall spacer is formed on the ONO film to prevent the generation of a damage layer in the ONO film, and the silicide layer on the memory gate electrode reduces the resistance of the memory gate electrode. The semiconductor device of the present embodiment will be described below with reference to FIG. 9 to FIG. 11.

Figure 9:
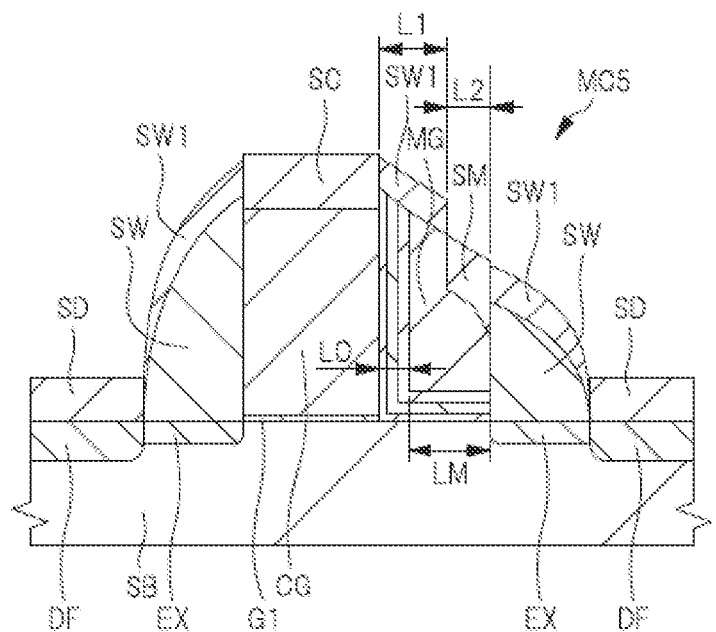
FIG. 9 is a cross-sectional view showing a semiconductor device that is a second embodiment.

The structure of the memory cell MC5 of the present embodiment shown in FIG. 9 is substantially the same as the structure of the memory cell MC1 of the first embodiment as the structure in the semiconductor substrate SB and the structure of the dielectric film G1, the ONO film ON and the sidewall spacer SW. However, there is no cap insulating film (insulating films IF1, IF2 in FIG. 1) on the control gate electrode CG, and the silicide layer SC extending along the gate width direction together with the control gate electrode SC is formed in contact with the upper surface of the control gate electrode CG. The dielectric film G1, the control gate electrode CG, and the silicide layer SC sequentially formed on the semiconductor substrate SB configure a third laminated pattern.

The ONO film ON is formed on the upper surface of the semiconductor substrate SB and on one side surface of the third laminated pattern, and includes a silicon nitride film N1 which is a charge storage portion. The memory gate electrode MG is formed on the ONO film ON so as to be adjacent to the control gate electrode CG.

Here, the memory gate electrode MG has the silicide layer SM on the upper surface facing away from the control gate electrode CG. The silicide layer SM is not formed on the upper surface of the memory gate electrode MG on the control gate electrode CG side. In other words, the upper surface of the memory gate electrode MG in the region in contact with the ONO film ON covering the side surface of the control gate electrode CG is exposed from the silicide layer SM. That is, the ONO film ON between the memory gate electrode MG and the control gate electrode CG is spaced apart from the silicide layer SM in the gate length direction.

The ONO film ON is not in contact with the silicide layer SC. That is, the height of the ONO film ON is less than the height of the control gate electrode CG, and the silicide layer SC and the ONO film ON are spaced apart from each other.

The sidewall spacer SW on the control gate electrode CG side is formed on the side surface so as to cover the other side surface of the third laminated pattern. The sidewall spacer SW on the memory gate electrode MG side is formed on the side surface so as to cover the side surface of the memory gate electrode MG on the other side of the control gate electrode CG. The sidewall spacer SW1 covers the upper surface of the sidewall spacer SW on the control gate electrode CG side, the upper surface of each of the ONO film ON and the memory gate electrode MG adjacent to each other in the gate length direction, and the upper surface the sidewall spacer SW on the memory gate electrode MG side. The upper surface of the ONO film ON and the upper surface of the memory gate electrode MG adjacent to each other are continuously covered with the sidewall spacer SW1. The sidewall spacer SW1 is formed of, for example, a silicon oxide film, and the thickness in the height direction (film thickness direction) thereof is equal to or greater than the implantation depth of the diffusion layer DF.

The silicide layer SM is formed by forming a sidewall spacer SW1, partially removing the sidewall spacer SW1 so as to expose the upper surface of the memory gate electrode MG opposite the control gate electrode CG side, and performing a salicide process in this state. The sidewall spacer SW1 covering the upper surface of the sidewall spacer SW on the control gate electrode CG side covers a part of the side surface of the third laminated pattern, that is, the side surface of the silicide layer SC. In addition, the sidewall spacer SW1 that continuously covers the upper surface of the ONO film ON and a part of the upper surface of the memory gate electrode MG covers a part of the other side surface of the third laminated pattern, that is, the other side surface of the silicide layer SC.

With this structure, in the memory cell MC5 of the present embodiment, the control gate electrode CG and the memory gate electrode MG in contact with the ONO film ON are both made of polysilicon only. Therefore, by forming the silicide layers SC, SM, the resistance of the control gate electrode CG and the memory gate electrode MG can be reduced, and the breakdown voltage between the control gate electrode CG and the memory gate electrode MG can be improved.

Also, the upper surface of the ONO film ON is covered with a sidewall spacer SW1 having a thickness equal to or greater than the implantation depth of the diffusion layer DF. Because the diffusion layer DF is formed by ion-implantation while the sidewall spacer SW1 is formed, although the impurities are implanted into the sidewall spacer SW1, the impurities are prevented from being implanted into the ONO film ON. Therefore, the breakdown voltage between the control gate electrode CG and the memory gate electrode MG is prevented from decreasing due to the generation of the damage layer DL.

In order to protect the ONO film ON from the implantation damage caused by the implantation process of the diffusion layer DF, the thickness of the sidewall spacer SW1 on the ONO film ON needs to be larger than the depth of the diffusion layer DF (the implantation depth into the sidewall spacer SW1). In addition, in order for the silicide layer SC not to be in contact with the ONO film ON, the lower surface of the silicide layer SC needs to be above the top of the memory gate electrode MG. In order to realize this structure, the height of the memory gate electrode MG and the height of the laminated film including the control gate electrode CG and the silicide layer SC need to be different from each other by the above-described implantation depth or more.

In order to make the memory gate electrode MG in contact with the ONO film ON only polysilicon while reducing the resistance of the memory gate electrode MG by the silicide layer SM, it is desirable that the upper surface of the memory gate electrode MG is silicided about ½ or more of the width LM of the memory gate electrode MG in the gate length direction. That is, the width L2 of the silicide layer SM in the gate length direction is represented by L2≥LM/2.

For this purpose, in the gate length direction, the width L1 of the sidewall spacer SW1 on the ONO film ON needs to be larger than the thickness LO of the ONO film ON and less than the sum of the film thickness LO of the ONO film ON and ½ of the width LM of the memory gate electrode MG. That is, the width L1 is represented by LO≤L1≤LO+LM/2. LO is a distance (thickness) of the ONO film ON between the control gate electrode CG and the memory gate electrode MG in the gate length direction.

Figure 10:
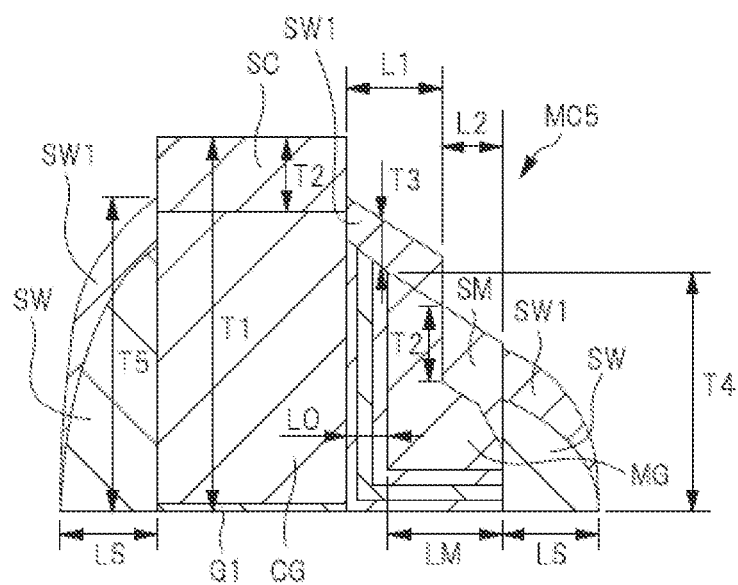
FIG. 10 is an enlarged cross-sectional view showing a semiconductor device that is the second embodiment.
Figure 11:
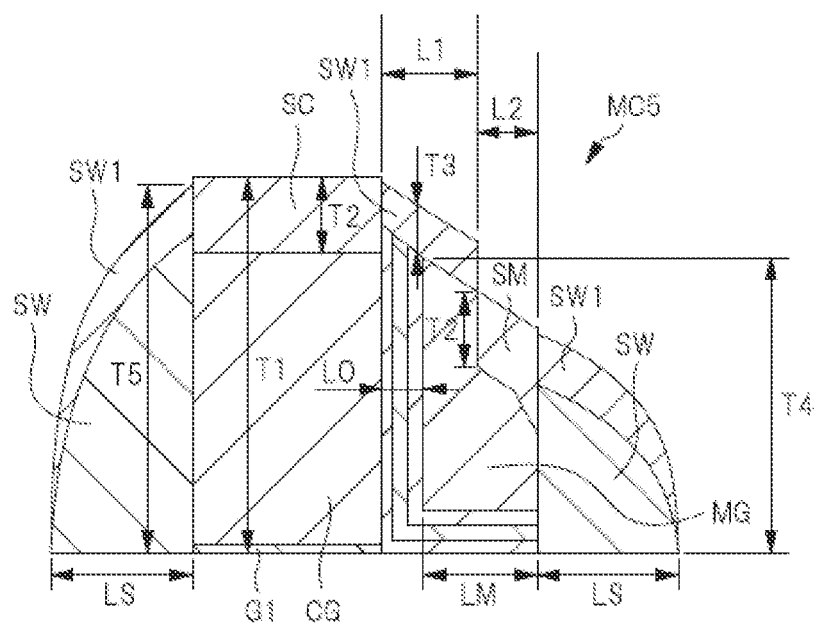
FIG. 11 is an enlarged cross-sectional view showing the semiconductor device according to the second embodiment.

The lengths of the respective parts of the memory cell MC5 when the above-described structure is realized will be specifically described with reference to FIG. 10 and FIG. 11. FIG. and FIG. 11 are each cross-sectional view showing a part of FIG. 9 in an enlarged manner, and in FIG. 10 and FIG. 11, the dimensions of the part of the structure differ. In FIG. 10 and FIG. 11, the illustration of the silicide layer on the semiconductor substrate and on the diffusion layer is omitted for the sake of clarity.

As shown in FIGS. 10 and 11, the laminated film formed of the dielectric film G1, the control gate electrode CG, and the silicide layer SC has a film thickness T1 in the height direction. Each of the silicide layers SC, SM has a film thickness T2 in the height direction. The sidewall spacer SW1 has a film thickness T3 in the height direction. The memory gate electrode MG has a height T4. The laminated film formed of the sidewall spacers SW, SW1 on the control gate electrode CG side has a height T5. The memory gate electrode MG has a width LM in the gate length direction. The sidewall spacer SW has a width LS in the gate length direction.

Here, when a sidewall spacer is formed on a side surface of a predetermined pattern by etch-back, the height of the side surface is required to be 10/7 times or more of the width of the sidewall spacer (the thickness of the film deposited when forming the sidewall spacer) from the empirical rule. When the height of the side surface is less than 10/7 times the thickness of the film deposited when forming the sidewall spacer, the width of the sidewall spacer is reduced, which affects the cell characteristics. If the above requirement of 10/7 times or more is satisfied, there is an extension implantation of the 21st power level, and therefore, even if there is a penetration of the impurity ions of the 19th power level, the cell characteristics are not affected.

Here, the film thickness 250 nm of the polysilicon film deposited in forming the control gate electrode CG is finally set to be equal to or larger than the film thickness 220 nm through etch-back of the sidewall spacers SW, SW1 or the like. This ensures a film thickness that does not allow implantation to penetrate the polysilicon film when forming the diffusion layer DF (not shown). The thickness T2 of the respective silicide layers is set to 40 nm and is shallower than the implantation depth 80 nm of the diffusion layer DF. The width LM of the memory gate electrode MG is set to 50 nm to ensure reliability. In order to suppress the short-channel effect, the width LS of the sidewall spacer SW is set to 45 nm.

In the ion implantation in forming the diffusion layer DF, when a cell structure in which the depth of the diffusion layer DF is set to 20 nm when the high concentration implantation of the 21st power level is performed is assumed, the height T4 is controlled to be 135 nm and the height T5 is controlled to be 184 nm (refer to FIG. 10) at a minimum, and the height T4 is controlled to be 171 nm and the height T5 is controlled to be 220 nm (see FIG. 11) at a maximum. This ensures the structure condition of the semiconductor device of the present embodiment. That is, the height T4 of the memory gate electrode MG is 135 to 171 nm. In addition, the height T5 of the laminated film formed of the sidewall spacers SW, SW1 on the control gate electrode CG side is 184 to 220 nm.

In this way, the range of the height T4 and the range of the height T5 have respective margins of equal to or less than 36 nm. As shown in FIG. 10, when the height T4 is the lower limit (135 nm), a sidewall spacer SW1 made of a silicon oxide film having a high concentration implantation depth or more is left on the ONO film ON so that the silicon oxide film does not remain on the control gate electrode CG so that the upper portion of the control gate electrode CG can be silicided. Then, the thickness of the silicon oxide film on the ONO film ON needs to be equal to or greater than 20 nm (high concentration implantation depth) and equal to or less than 56 nm (high concentration implantation depth plus 36 nm).

The difference between the height T4 and the height T5 in FIG. 10 and the difference between the height T4 and the height T5 in FIG. 11 are 49 nm. 49 nm which is the difference in the vertical direction is the sum of the film thickness T3 (20 nm) of the sidewall spacer SW1 and the thickness (29 nm) of 10/7 times the film thickness LO of the ONO film ON.

Although the invention made by the present inventor has been specifically described based on the embodiment, the present invention is not limited to the as described above embodiment, and it is needless to say that various modifications can be made without departing from the gist thereof.

What is claimed is:
1. A semiconductor device comprising:
a semiconductor substrate;
a first laminated pattern formed of a first gate dielectric film formed on an upper surface of the semiconductor substrate, a first gate electrode formed on the first gate dielectric film, and a first dielectric film formed on the first gate electrode;
a second gate dielectric film formed on the upper surface of the semiconductor substrate and on a side surface of the first laminated pattern, the second gate dielectric film including a charge storage portion;

a second gate electrode formed on the second gate dielectric film so as to be adjacent to the first gate electrode;
a first silicide layer formed on an upper surface of the second gate electrode; and
a first source region and a first drain region each formed in the semiconductor substrate exposed from the first laminated pattern and the second gate electrode,
wherein each of the first gate electrode and the second gate electrode is formed of a semiconductor film,
wherein each of the first source region and the first drain region has a first conductivity type first semiconductor region, and a first conductivity type second semiconductor region having a higher impurity concentration than the first semiconductor region,
wherein an upper surface of the first gate electrode is lower than the highest position of a lower surface of the first silicide layer, and
wherein a difference between the upper surface of the first gate electrode and the highest position of an upper surface of the first silicide layer is equal to or larger than a depth of the second semiconductor region.

2. The semiconductor device according to claim 1,
wherein a difference between a first height between the upper surface of the semiconductor substrate and the highest position of the first silicide layer and a second height between the upper surface of the semiconductor substrate and the upper surface of the first gate electrode is equal to or larger than the depth of the second semiconductor region.

3. The semiconductor device according to claim 2,
wherein the difference between the first height and the second height is equal to or greater than 30 nm.

4. The semiconductor device according to claim 1,
wherein the first gate electrode, the second gate electrode, the first source region and the first drain region configure a nonvolatile memory element.

5. The semiconductor device according to claim 4,
wherein the upper surface of the first gate electrode configuring the nonvolatile memory element is exposed from a silicide layer.

6. The semiconductor device according to claim 4, comprising:
a third gate electrode formed on the upper surface of the semiconductor substrate via a third gate dielectric film;
a second silicide layer formed on an upper surface of the third gate electrode; and
a second source region and a second drain region each formed in the semiconductor substrate exposed from the third gate electrode,
wherein the third gate electrode is formed of a semiconductor film,
wherein a height between the upper surface of the semiconductor substrate and the upper surface of the first gate electrode is lower than a height between the upper surface of the semiconductor substrate and the upper surface of the third gate electrode.

7. The semiconductor device according to claim 6,
wherein the third gate electrode, the second source region and the second drain region configure a field effect transistor,
wherein, in plan view, the semiconductor substrate includes a first region and a second region different from each other, and
wherein the nonvolatile memory element is formed in the first region, and the field effect transistor is formed in the second region.

8. The semiconductor device according to claim 1, comprising:
an element isolation region embedded in a trench formed in the upper surface of the semiconductor substrate,
wherein an upper surface of the element isolation region is recessed with reference to the upper surface of the semiconductor substrate,
wherein the second gate electrode extends over the element isolation region in a first direction along the upper surface of the semiconductor substrate, and
wherein, in a direction perpendicular to the upper surface of the semiconductor substrate, a difference between a position of an upper surface of the first dielectric film and the highest position of the upper surface of the second gate electrode is equal to or larger than a distance between the upper surface of the element isolation region and the upper surface of the semiconductor substrate.

9. A semiconductor device, comprising:
a semiconductor substrate;
a first gate electrode formed on an upper surface of the semiconductor substrate via a first gate dielectric film;
a second gate dielectric film formed on the upper surface of the semiconductor substrate and on a side surface of the first gate electrode, the second gate dielectric film including a charge storage portion;
a second gate electrode formed on the second gate dielectric film so as to be adjacent to the first gate electrode;
a first silicide layer formed on an upper surface of the second gate electrode;
a first source region and a first drain region each formed in the semiconductor substrate exposed from the first gate electrode and the second gate electrode;
a sidewall spacer formed on a side surface of the first gate electrode; and
an interlayer dielectric film formed on the semiconductor substrate, the interlayer dielectric film covering the first gate electrode, the second gate electrode and the sidewall spacer,
wherein each of the first gate electrode and the second gate electrode is formed of a semiconductor film,
wherein each of the first source region and the first drain region has a first conductivity type first semiconductor region, and a first conductivity type second semiconductor region having a higher impurity concentration than the first semiconductor region,
wherein a concave portion is formed on the first gate electrode, the concave portion being configured from:
an upper surface of the first gate electrode;
a part of the sidewall spacer located above the upper surface of the first gate electrode; and
a part of the second gate dielectric film located above the upper surface of the first gate electrode,
wherein a part of the interlayer dielectric film is formed in the concave portion, and
wherein a difference between the upper surface of the first gate electrode and the highest position of an upper surface of the second gate electrode is equal to or larger than a depth of the second semiconductor region.

10. The semiconductor device according to claim 9,
wherein the first gate electrode, the second gate electrode, the first source region and the first drain region configure a nonvolatile memory element.

11. A semiconductor device, comprising:
a semiconductor substrate;
a third laminated pattern formed of a first gate dielectric film formed on an upper surface of the semiconductor substrate, a first gate electrode formed on the first gate dielectric film, and a first silicide layer formed on the first gate electrode;

a second gate dielectric film formed on the upper surface of the semiconductor substrate and on a first side surface of the third laminated pattern, the second gate dielectric film including a charge storage portion;

a second gate electrode formed on the second gate dielectric film so as to be adjacent to the first gate electrode;

a second silicide layer formed on an upper surface of the second gate electrode and spaced apart from the second gate dielectric film;

a first source region and a first drain region each formed in the semiconductor substrate exposed from the third laminated pattern and the second gate electrode;

a first sidewall spacer formed on a second side surface of the third laminated pattern so as to cover the second side surface;

a second sidewall spacer formed on a side surface of the second gate electrode opposite the first gate electrode side so as to cover the side surface of the second gate electrode;

a third sidewall spacer formed on an upper surface of the first sidewall spacer so as to cover a part of the second side surface; and a fourth sidewall spacer formed on an upper surface of the second gate dielectric film and on a part of the upper surface of the second gate electrode so as to cover a part of the first side surface, wherein each of the first gate electrode and the second gate electrode is formed of a semiconductor film, wherein each of the first source region and the first drain region has a first conductivity type first semiconductor region, and a first conductivity type second semiconductor region having a higher impurity concentration than the first semiconductor region, wherein, in a direction perpendicular to the upper surface of the semiconductor substrate, a film thickness of the fourth sidewall spacer is larger than a depth of the second semiconductor region, wherein a lower surface of the first silicide layer is located above a top of the second gate electrode, wherein, in plan view, a width of the fourth sidewall spacer is larger than a film thickness of the second gate dielectric film and smaller than a sum of the film thickness of the second gate dielectric film and a half of a width of the second gate electrode.

12. The semiconductor device according to claim 11, wherein the first gate electrode, the second gate electrode, the first source region and the first drain region configure a nonvolatile memory element, wherein the first gate electrode and the second gate electrode extend in a first direction along the upper surface of the semiconductor substrate, and wherein the width of the fourth sidewall spacer is a width in a second direction intersecting with the first direction.

* * * * *